(12) United States Patent
Nakanishi

(10) Patent No.: US 12,560,875 B2
(45) Date of Patent: Feb. 24, 2026

(54) EXPOSURE APPARATUS, IMAGE-FORMING APPARATUS AND MANUFACTURING METHOD

(71) Applicant: CANON KABUSHIKI KAISHA, Tokyo (JP)

(72) Inventor: Koichiro Nakanishi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 36 days.

(21) Appl. No.: 18/783,123

(22) Filed: Jul. 24, 2024

(65) Prior Publication Data

US 2025/0036038 A1 Jan. 30, 2025

(30) Foreign Application Priority Data

Jul. 28, 2023 (JP) ................................. 2023-123761

(51) Int. Cl.
 *G03G 15/04* (2006.01)
 *H10K 59/80* (2023.01)
 *H10K 59/95* (2023.01)

(52) U.S. Cl.
 CPC ..... *G03G 15/04036* (2013.01); *H10K 59/873* (2023.02); *H10K 59/879* (2023.02); *H10K 59/95* (2023.02)

(58) Field of Classification Search
 CPC ....... G03G 15/04054; G03G 15/04063; G03G 15/04036; G03G 2215/0407; G03G 2215/0409; G03G 2215/0412; H10K 59/879; H10K 59/873; H10K 59/95
 See application file for complete search history.

(56) References Cited

U.S. PATENT DOCUMENTS

| | | | | |
|---|---|---|---|---|
| 2022/0171307 A1* | 6/2022 | Kamata | ............ | G03G 15/04063 |
| 2022/0197176 A1* | 6/2022 | Nakanishi | ........ | G03G 15/04054 |
| 2022/0197177 A1* | 6/2022 | Nakanishi | .................. | B41J 2/45 |

FOREIGN PATENT DOCUMENTS

| | | |
|---|---|---|
| JP | 2017183436 A | 10/2017 |
| JP | 2021035765 A | 3/2021 |

* cited by examiner

*Primary Examiner* — Sandra Brase
(74) *Attorney, Agent, or Firm* — Canon U.S.A., Inc. IP Division

(57) ABSTRACT

An exposure apparatus includes: light-emitting chips arranged in a staggered manner along a reference line that is parallel to an axial direction of a photosensitive member, each of which has a silicon substrate and a light-emitting element array that is an array of organic electro luminescence (EL) elements formed on a first surface of the silicon substrate; and a rod lens array that images light from the light-emitting element arrays of the light-emitting chips onto a surface of the photosensitive member. An interval between a first side of the silicon substrate of each light-emitting chip and the light-emitting element array of the light-emitting chip is equal to or larger than 20 micrometers, the first side being parallel to the reference line and closer to the reference line among sides of the silicon substrate.

10 Claims, 13 Drawing Sheets

F I G. 2A
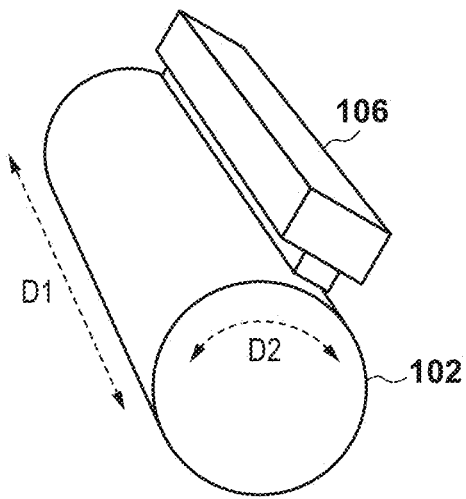
F I G. 2B
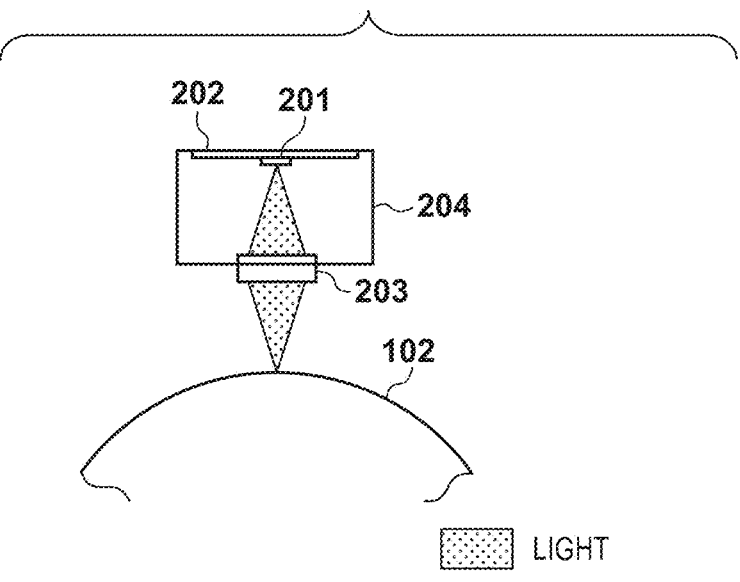
LIGHT

N COLUMNS OF LIGHT-EMITTING ELEMENTS

D1

D2

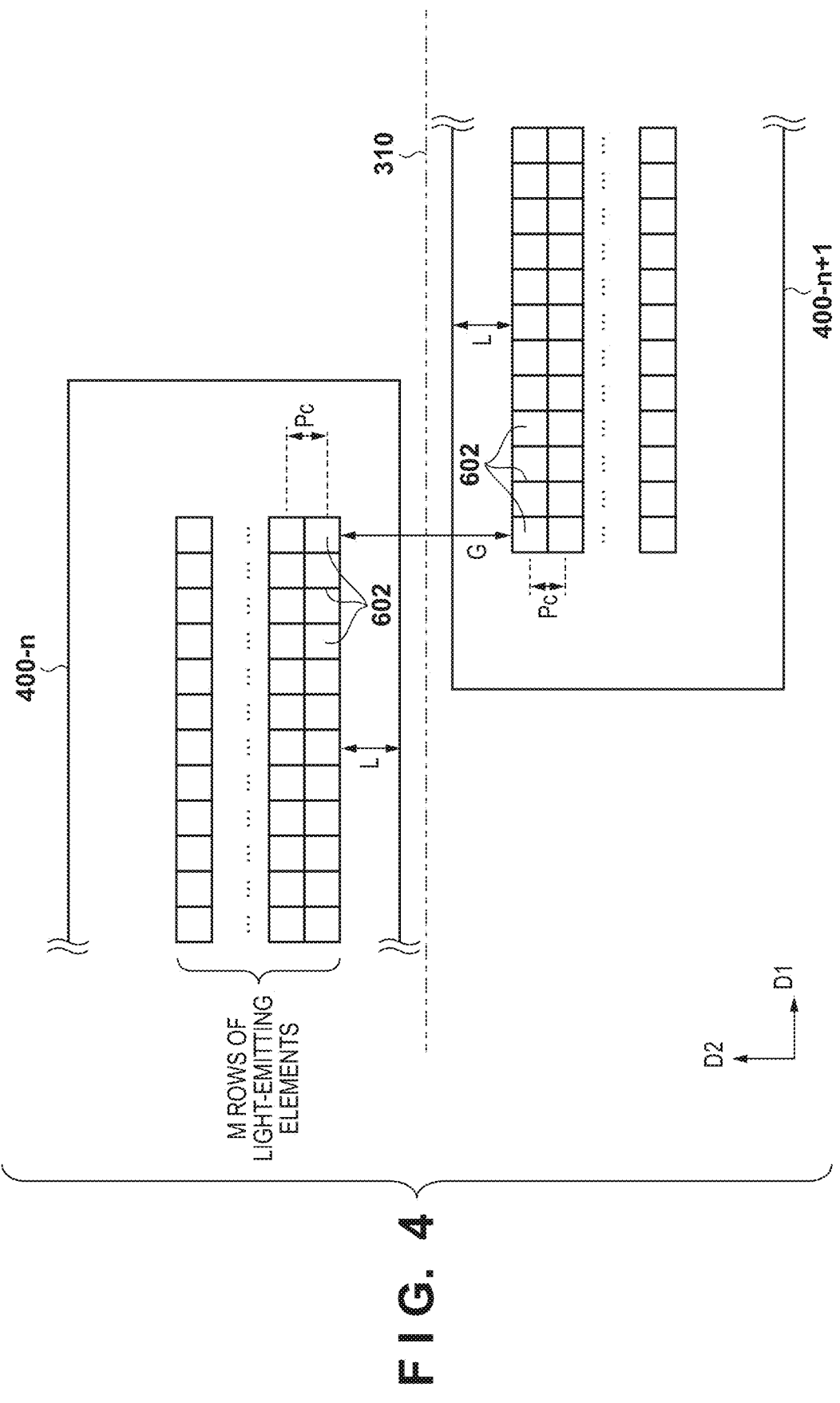
F I G. 4

F I G. 9
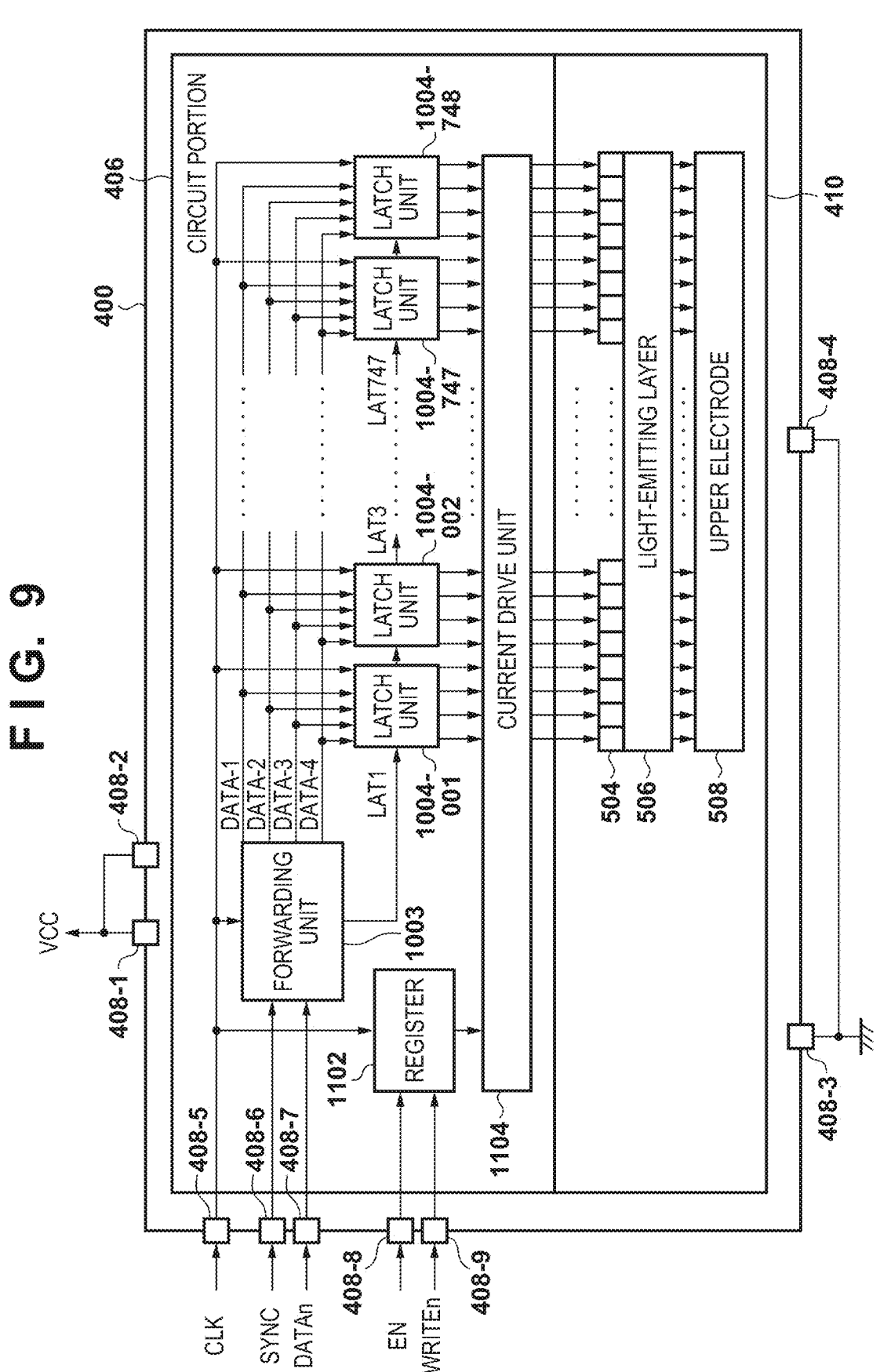

F I G. 13

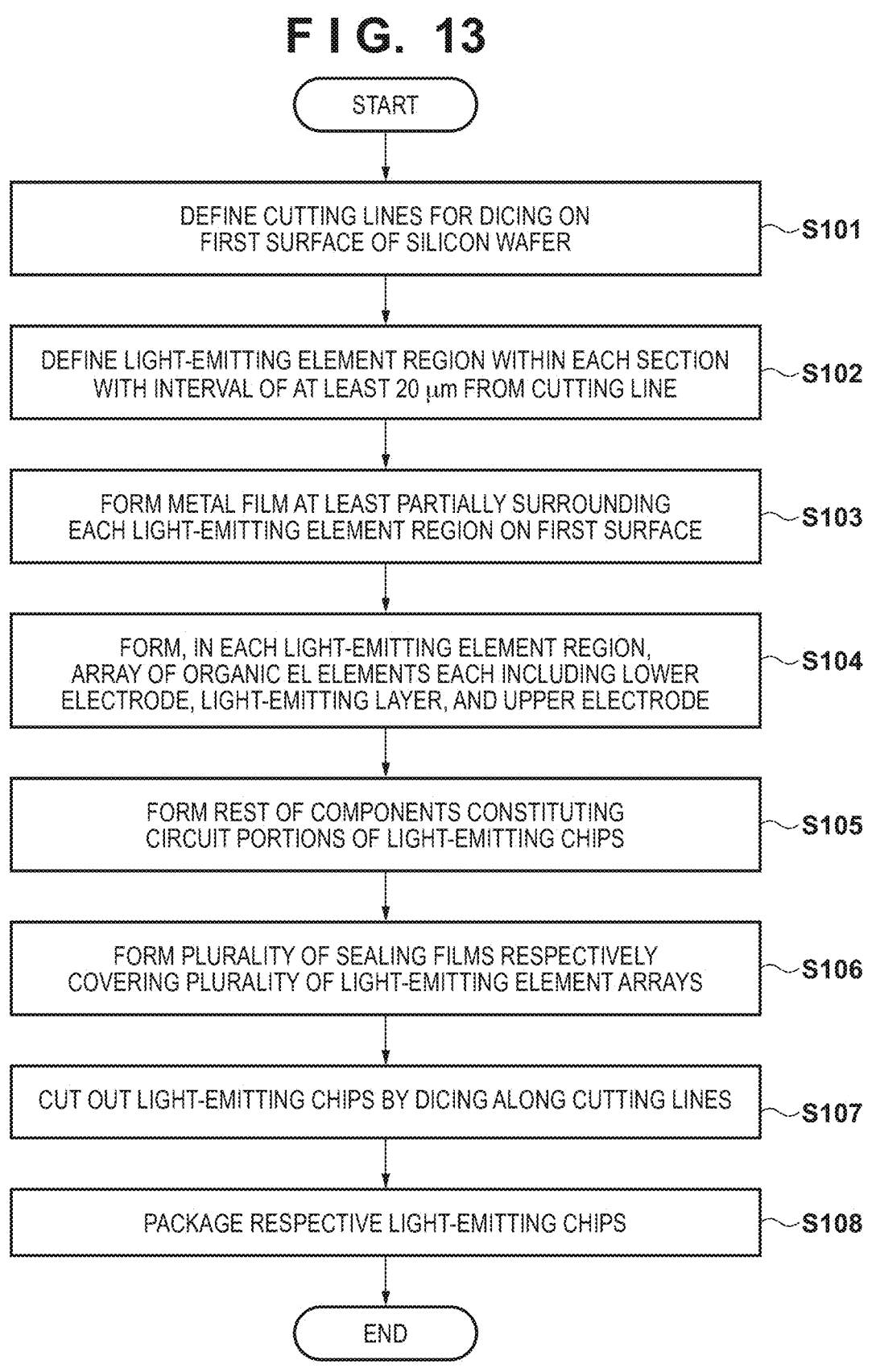

START

DEFINE CUTTING LINES FOR DICING ON
FIRST SURFACE OF SILICON WAFER — S101

DEFINE LIGHT-EMITTING ELEMENT REGION WITHIN EACH SECTION
WITH INTERVAL OF AT LEAST 20 μm FROM CUTTING LINE — S102

FORM METAL FILM AT LEAST PARTIALLY SURROUNDING
EACH LIGHT-EMITTING ELEMENT REGION ON FIRST SURFACE — S103

FORM, IN EACH LIGHT-EMITTING ELEMENT REGION,
ARRAY OF ORGANIC EL ELEMENTS EACH INCLUDING LOWER
ELECTRODE, LIGHT-EMITTING LAYER, AND UPPER ELECTRODE — S104

FORM REST OF COMPONENTS CONSTITUTING
CIRCUIT PORTIONS OF LIGHT-EMITTING CHIPS — S105

FORM PLURALITY OF SEALING FILMS RESPECTIVELY
COVERING PLURALITY OF LIGHT-EMITTING ELEMENT ARRAYS — S106

CUT OUT LIGHT-EMITTING CHIPS BY DICING ALONG CUTTING LINES — S107

PACKAGE RESPECTIVE LIGHT-EMITTING CHIPS — S108

END

EXPOSURE APPARATUS, IMAGE-FORMING APPARATUS AND MANUFACTURING METHOD

BACKGROUND

Field of the Disclosure

The present disclosure relates to an exposure apparatus, an image-forming apparatus and a manufacturing method.

Description of the Related Art

An electrophotographic image-forming apparatus forms an image by exposing a rotationally-driven photosensitive member with light to form an electrostatic latent image on it and developing the electrostatic latent image with toner. Among others, a solid-state exposure type exposure apparatus, that images light from a light-emitting element array onto a surface of a photosensitive member utilizing a rod lens array, is attracting attention because its downsizing, enhancing quietness, and cost reduction are easier compared to a laser-scanning type exposure apparatus.

Japanese Patent Laid-Open No. 2017-183436 discloses a solid-state exposure type exposure apparatus in which inorganic light-emitting diodes are adopted as light-emitting elements. In the exposure apparatus of Japanese Patent Laid-Open No. 2017-183436, a plurality of light-emitting chips each including a light-emitting element array are arranged in a staggered manner in parallel with an axial direction of a photosensitive member so as to eliminate gaps between the light-emitting chips. Japanese Patent Laid-Open No. 2021-35765 discloses a solid-state exposure type exposure apparatus in which organic electro luminescence (EL) elements are adopted. Also in the exposure apparatus of Japanese Patent Laid-Open No. 2021-35765, a plurality of light-emitting chips are arranged in a staggered manner in parallel with an axial direction of a photosensitive member. The organic EL elements are superior to the inorganic LEDs in that they consume less power.

In a case where a plurality of light-emitting chips are arranged in a staggered manner along a certain reference line, there will be a gap to some extent in a direction perpendicular to the reference line between light-emitting element arrays of the light-emitting chips at positions oddly numbered from an end and light-emitting element arrays of the light-emitting chips at even-numbered positions. By making this gap as small as possible, light can be efficiently introduced into a rod lens array. However, the inventors have found an issue that reducing the gap between the light-emitting element arrays results in an insufficient interval between edges of the light-emitting chips and the light-emitting element arrays, which increases likelihood of deterioration of organic EL elements due to moisture and oxygen of outside air intruding through the edges. The deteriorated organic EL elements will be in a so-called non-illuminated state, in which they do not emit light even while being supplied with driving current. The non-illumination may be detected not only as an initial failure at the time of manufacturing an apparatus, but also may increase after use of the apparatus is started.

SUMMARY OF THE DISCLOSURE

The present disclosure aims at providing an exposure apparatus that is highly reliable with improved resistance against outside air intrusion.

According to an aspect of the subject disclosure, there is provided an exposure apparatus including: a plurality of light-emitting chips arranged in a staggered manner along a reference line that is parallel to an axial direction of a photosensitive member, each of the plurality of light-emitting chips having a silicon substrate and a light-emitting element array that is an array of organic electro luminescence (EL) elements formed on a first surface of the silicon substrate; and a rod lens array that images light from the light-emitting element arrays of the plurality of light-emitting chips onto a surface of the photosensitive member. An interval between a first side of the silicon substrate of each light-emitting chip and the light-emitting element array of the light-emitting chip is equal to or larger than 20 micrometers, the first side being parallel to the reference line and closer to the reference line among sides of the silicon substrate. There is also provided an image-forming apparatus including the exposure apparatus and the photosensitive member.

According to another aspect of the subject disclosure, there is provided a manufacturing method for manufacturing a light-emitting chip for use in an exposure apparatus configured to expose a photosensitive member with light from a plurality of light-emitting chips, including: forming, on a first surface of a silicon substrate, a plurality of light-emitting element arrays spaced apart from each other, each of the plurality of light-emitting element arrays being an array of organic electro luminescence (EL) elements; forming, on the first surface of the silicon substrate, a plurality of sealing films to cover the plurality of light-emitting element arrays, respectively, the sealing films being made of an insulating inorganic material; and cutting the silicon substrate along a cutting line located in a non-sealed region that is not covered by the plurality of sealing films.

Further features of the present disclosure will become apparent from the following description of exemplary embodiments (with reference to the attached drawings).

BRIEF DESCRIPTION OF THE DRAWINGS

FIG. 2A is a first illustrative diagram showing a configuration of a photosensitive member and an exposure head according to an embodiment of the subject disclosure.

FIG. 2B is a second illustrative diagram showing a configuration of the photosensitive member and the exposure head according to an embodiment of the subject disclosure.

FIG. 3A is a first illustrative diagram showing a configuration of a printed circuit board of the exposure head according to an embodiment of the subject disclosure.

FIG. 3B is a second illustrative diagram showing a configuration of the printed circuit board of the exposure head according to an embodiment of the subject disclosure.

FIG. 4 is an illustrative diagram regarding light-emitting chips and light-emitting element arrays in the light-emitting chips according to an embodiment of the subject disclosure.

FIG. 9 is a functional block diagram showing a detailed circuit configuration of the light-emitting chip according to an embodiment of the subject disclosure.

FIG. 13 is a flowchart illustrating an example of a flow of a method of manufacturing light-emitting chips according to an embodiment of the subject disclosure.

DESCRIPTION OF THE EMBODIMENTS

Figure 1:
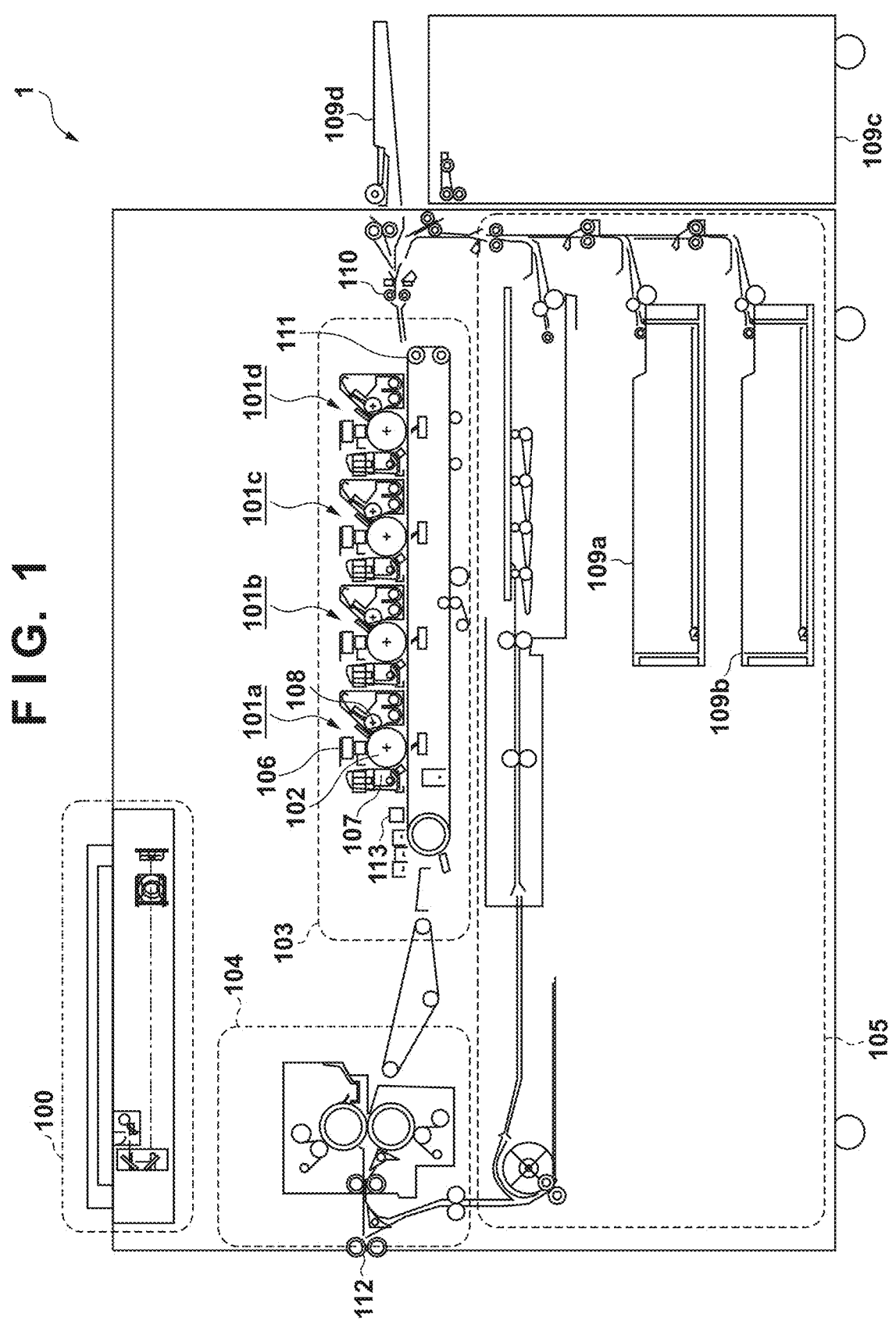
FIG. 1 is a configuration diagram showing a schematic configuration of an image-forming apparatus according to an embodiment of the subject disclosure.

Hereinafter, embodiments will be described in detail with reference to the attached drawings. Note, the following embodiments are not intended to limit the scope of the claimed disclosure. Multiple features are described in the embodiments, but limitation is not made to a disclosure that requires all such features, and multiple such features may be combined as appropriate.

Furthermore, in the attached drawings, the same reference numerals are given to the same or similar configurations, and redundant description thereof is omitted.

1. Schematic Configuration of Image-Forming Apparatus

FIG. 1 shows an example of a schematic configuration of an image-forming apparatus 1 according to an embodiment. The image-forming apparatus 1 includes a reading unit 100, an image-making unit 103, a fixing unit 104, and a transport unit 105. The reading unit 100 optically reads an original placed on a platen and generates read image data. The image-making unit 103 forms an image on a sheet based on the read image data generated by the reading unit 100 or based on print image data received from an external device via a network, for example.

The image-making unit 103 includes image-forming units 101a, 101b, 101c, and 101d. The image-forming units 101a, 101b, 101c, and 101d form toner images in black, yellow, magenta, and cyan, respectively. The image-forming units 101a, 101b, 101c and 101d have the same configuration, and are also referred to collectively as image-forming units 101 below. A photosensitive member 102 of the image-forming unit 101 is driven to rotate in the clockwise direction in the figure during image formation. A charger 107 electrically charges the photosensitive member 102. An exposure head 106 exposes the photosensitive member 102 with light to form an electrostatic latent image on a surface of the photosensitive member 102. A developer 108 develops the electrostatic latent image on the photosensitive member 102 with toner to form a toner image. The toner image formed on the surface of the photosensitive member 102 is transferred to a sheet that is being transported on a transfer belt 111. A color image containing four color components, namely black, yellow, magenta, and cyan can be formed by transferring the toner images of the four photosensitive members 102 to the sheet in a superimposed manner.

The transport unit 105 controls feed and transport of sheets. Specifically, the transport unit 105 feeds a sheet from a unit designated from among internal storage units 109a and 109b, an external storage unit 109c, and a manual feed unit 109d to a transport path in the image-forming apparatus 1. The fed sheet is transported to a registration roller 110. The registration roller 110 transports the sheet onto the transfer belt 111 at an appropriate timing such that the toner image of each photosensitive member 102 is transferred to the sheet. As mentioned above, the toner images are transferred to the sheet while the sheet is transported on the transfer belt 111. The fixing unit 104 fixes the toner images to the sheet by heating and pressurizing the sheet to which the toner images have been transferred. After the toner images have been fixed, the sheet is discharged to outside the image-forming apparatus 1 by a discharge roller 112. An optical sensor 113 is located at a position facing the transfer belt 111. The optical sensor 113 optically reads a test chart formed on the transfer belt 111 by the image-forming units 101. In a case where an error in an image-forming range is detected for the test chart read by the optical sensor 113, an image controller 700 described below performs control for compensating for the error when executing subsequent jobs.

Although an example in which the toner image is directly transferred from each photosensitive member 102 to the sheet on the transfer belt 111 has been described here, the toner image may alternatively be transferred indirectly from each photosensitive member 102 to the sheet via an intermediate transfer member. Further, although an example of forming a color image using toner of multiple colors has been described here, the technology according to the present disclosure is also applicable to an image-forming apparatus that forms a monochrome image using toner of a single color.

2. Configuration Example of Exposure Head

FIGS. 2A and 2B show the photosensitive member 102 and the exposure head 106. The exposure head 106 includes a light-emitting element array 201, a printed circuit board 202 on which the light-emitting element array 201 is mounted, a rod lens array 203, and a housing 204 supporting the printed circuit board 202 and the rod lens array 203. The photosensitive member 102 has a cylindrical shape. The exposure head 106 is arranged such that the longitudinal direction thereof is parallel with an axial direction D1 of the photosensitive member 102, and a face of the exposure head 106 to which the rod lens array 203 is attached faces the surface of the photosensitive member 102. While the photosensitive member 102 rotates in a circumferential direction D2, the light-emitting element array 201 of the exposure head 106 emits light, and the rod lens array 203 images the light onto the surface of the photosensitive member 102.

Figures 3A, 3B:
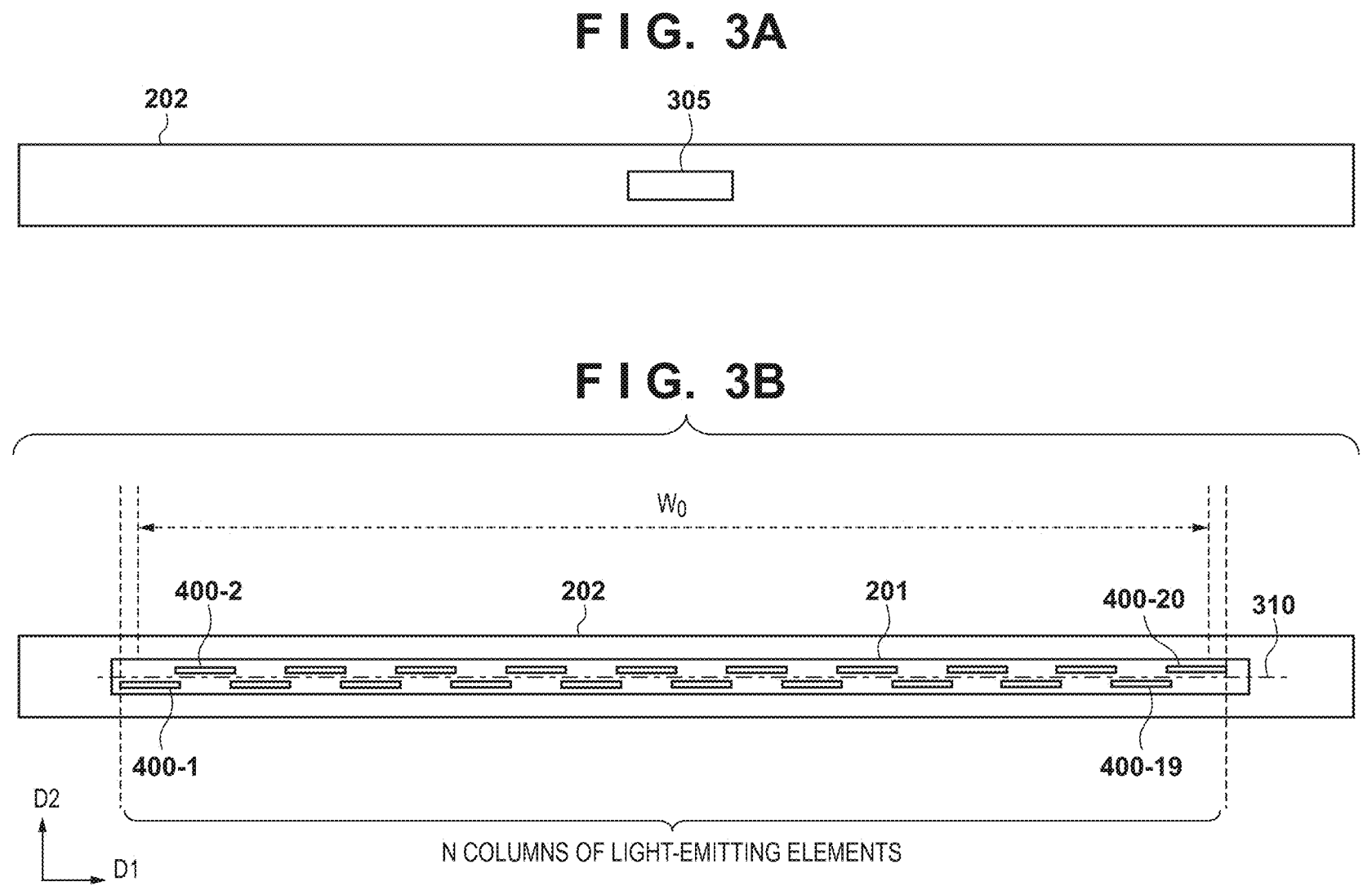

FIGS. 3A and 3B show an example of a configuration of the printed circuit board 202. Note that FIG. 3A shows a face on which a connector 305 is mounted, and FIG. 3B shows a face on which the light-emitting element array 201 is mounted (a face on the side opposite to the face on which the connector 305 is mounted). FIG. 4 schematically shows light-emitting chips 400 and arrays of light-emitting elements 602 in the light-emitting chips 400.

In the present embodiment, the light-emitting element array 201 has a plurality of light-emitting elements that are arranged two-dimensionally. The light-emitting element array 201 as a whole includes light-emitting elements in N columns in the axial direction D1 and M rows in the circumferential direction D2 of the photosensitive member, where M and N are integers no less than two. In the example of FIG. 3B, the light-emitting element array 201 is constituted by separate twenty light-emitting chips 400-1 to 400-20, each of which includes a subset of the entire plurality of light-emitting elements. The light-emitting chips 400-1 to 400-20 are arranged in a staggered manner along a reference line 310 that is parallel to the axial direction D1. The light-emitting chips 400-1 to 400-20 are also referred to collectively as light-emitting chips 400. As illustrated in FIG. 3B, the range occupied by the entire light-emitting elements of the twenty light-emitting chips in the axial direction D1 is wider than the range occupied by the maximum width Wo of input image data. Accordingly, some light-emitting elements located at both ends in the axial direction D1 may not be used for exposing the photosensitive member 102 unless an error in the image-forming range is detected. Each light-emitting chip 400 on the printed circuit board 202 is connected to the image controller 700 (FIG. 6) via the connector 305. In the following, there are cases where the smaller branch number side of the light-emitting chips 400-1 to 400-20 arranged in the axial direction D1 is referred to as "left" and the larger branch number side as "right", for convenience of description. For example, the light-emitting chip 400-1 is a light-emitting chip 400 at the left end, and the light-emitting chip 400-20 is a light-emitting chip at the right end. The reference line 310 is parallel to the axial direction D1 and passes through the midpoint in the circumferential direction D2 between the odd-numbered light-emitting chips 400-1, 400-3, . . . and the even-numbered light-emitting chips 400-2, 400-4, . . . .

The number J of light-emitting elements 602 arranged in each row of one light-emitting chip 400 (J=N/20) may be equal to 748 (J=748), for example. Meanwhile, the number M of light-emitting elements 602 arranged in each column of one light-emitting chip 400 may be equal to 4 (M=4), for example. That is to say, in an example embodiment, each light-emitting chip 400 has 2992 (=748*4) light-emitting elements 602 in total, with 748 elements in the axial direction D1 and 4 elements in the circumferential direction D2. The interval Pc between central points of light-emitting elements 602 adjoining in the circumferential direction D2 may be approximately 21.16 μm corresponding to a resolution of 1200 dpi, for example. The interval between central points of light-emitting elements 602 adjoining in the axial direction D1 may also be approximately 21.16 μm and, in this case, 748 light-emitting elements 602 occupy the length of approximately 15.8 mm in the axial direction D1. It should be noted that, for convenience of description, FIG. 4 shows an example where the light-emitting elements 602 are arranged completely in a grid-like pattern in each light-emitting chip 400, however, the M (M=4) light-emitting elements 602 of each column may be arranged in a staircase pattern or in a partially-staircase pattern. The arrangement of light-emitting elements 602 in a staircase pattern will be further described below.

Figure 5:
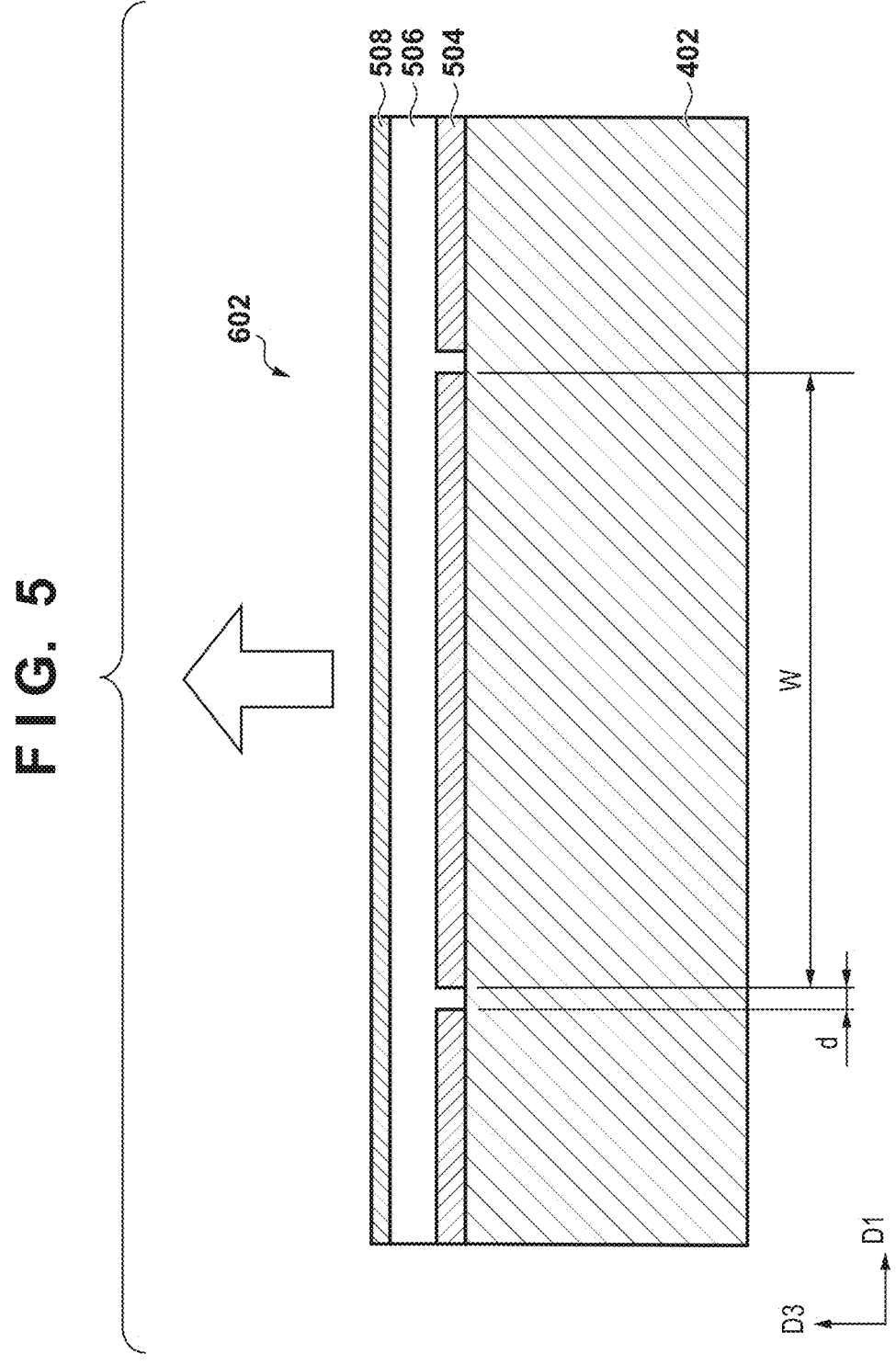
FIG. 5 is a cross-sectional view showing an example of a configuration of the light-emitting element according to an embodiment of the subject disclosure.

FIG. 5 is a cross-sectional view showing an example of a configuration of the light-emitting element 602. A plurality of lower electrodes 504 are formed on a light-emitting substrate 402 which is a silicon substrate. A gap with length d is provided between two adjoining lower electrodes 504. A light-emitting layer 506 is provided on the lower electrodes 504, and an upper electrode 508 is provided on the light-emitting layer 506. The upper electrode 508 is one common electrode for the plurality of lower electrodes 504. When a voltage is applied between the lower electrodes 504 and the upper electrode 508, the light-emitting layer 506 emits light as a result of electric current flowing from the lower electrodes 504 to the upper electrode 508. Thus, one lower electrode 504 and partial regions of the light-emitting layer 506 and the upper electrode 508 that correspond to the lower electrode 504 constitute one light-emitting element 602. That is, in the present embodiment, the light-emitting substrate 402 includes a plurality of light-emitting elements 602.

An organic EL film is used as the light-emitting layer 506. That is, the light-emitting element 602 is an organic EL element. The upper electrode 508 is constituted by a transparent electrode made of indium tin oxide (ITO) or the like so as to allow the light-emission wavelength of the light-emitting layer 506 to pass through. Note that, in the present embodiment, the entire upper electrode 508 allows the light-emission wavelength of the light-emitting layer 506 to pass through, but the entire upper electrode 508 does not necessarily allow the light-emission wavelength of the light-emitting layer 506 to pass through. Specifically, it is sufficient that a partial region through which light from each light-emitting element 602 passes allows the light-emission wavelength to pass through.

Note that, in FIG. 5, one continuous light-emitting layer 506 is formed, but a plurality of light-emitting layers 506 each having a width equal to the width W of a corresponding lower electrode 504 may alternatively be formed on the respective lower electrodes 504. Further, in FIG. 5, the upper electrode 508 is formed as one common electrode for the plurality of lower electrodes 504; but, a plurality of upper electrodes 508 each having a width equal to the width W of a corresponding lower electrode 504 may alternatively be formed in correspondence with the respective lower electrodes 504. Further, a first plurality of lower electrodes 504, out of the lower electrodes 504 of each light-emitting chip 400, may be covered by a first light-emitting layer 506, and a second plurality of lower electrodes 504 may be covered by a second light-emitting layer 506. Similarly, a first upper electrode 508 may be formed in common for a first plurality of lower electrodes 504, out of the lower electrodes 504 of each light-emitting chip 400, and a second upper electrode 508 may be formed in common for a second plurality of lower electrodes 504. With such a configuration as well, one lower electrode 504 and regions of the light-emitting layer 506 and the upper electrode 508 that correspond to the lower electrode 504 constitute one light-emitting element 602.

Figure 6:
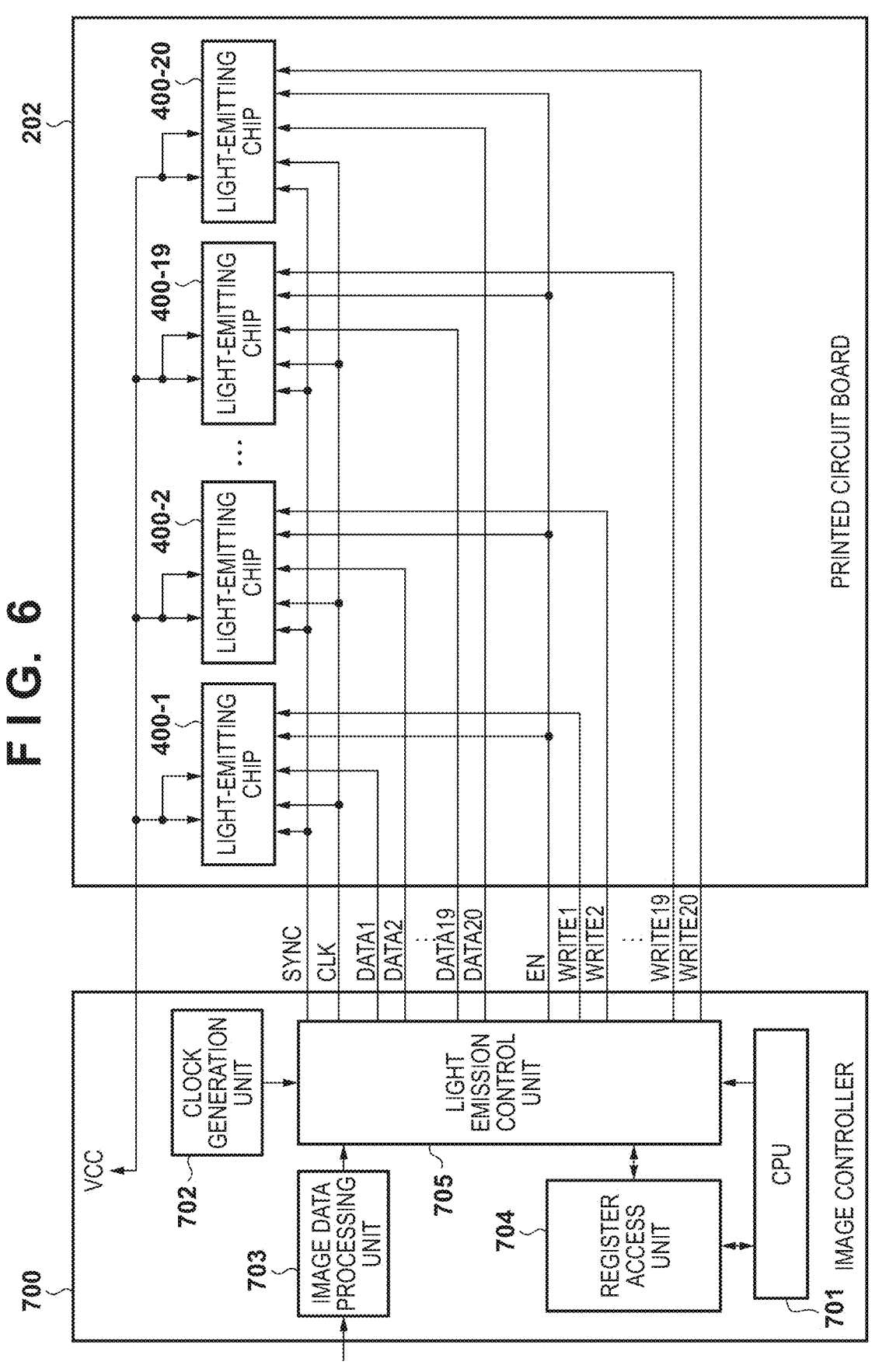
FIG. 6 is a circuit diagram showing a control configuration of an exposure apparatus according to an embodiment of the subject disclosure.

FIG. 6 is a circuit diagram related to a control configuration for controlling the light-emitting chips 400. The image controller 700 is a control circuit that communicates with the printed circuit board 202 via a plurality of signal lines (wires). The image controller 700 includes a CPU 701, a clock generation unit 702, an image data processing unit 703, a register access unit 704, and a light emission control unit 705. The light emission control unit 705 terminates the signal lines connected to the printed circuit board 202. An n-th light-emitting chip 400-n (n is an integer from 1 to 20) on the printed circuit board 202 is connected to the light emission control unit 705 via a signal line DATAn and a signal line WRITEn. The signal line DATAn is used to transmit image data from the image controller 700 to the light-emitting chip 400-n. The signal line WRITEn is used by the image controller 700 to write control data to a register of the light-emitting chip 400-n.

One signal line CLK, one signal line SYNC, and one signal line EN are also provided between the light emission control unit 705 and respective light-emitting chips 400. The signal line CLK is used to transmit a clock signal for data transmission over the signal lines DATAn and WRITEn. The light emission control unit 705 outputs, to the signal line CLK, a clock signal generated based on a reference clock signal from the clock generation unit 702. Signals transmitted to the signal line SYNC and the signal line EN will be described below.

The CPU 701 controls the entire image-forming apparatus 1. The image data processing unit 703 performs image processing on image data received from the reading unit 100 or an external device, and generates image data in a binary bitmap format for performing control to turn on and off light emission of the light-emitting elements 602 of the light-emitting chips 400 on the printed circuit board 202. Image processing here may include, for example, raster conversion, gradation correction, color conversion, and halftoning. The image data processing unit 703 transmits the generated image data as input image data to the light emission control unit 705. The register access unit 704 receives control data to be written in a register within each light-emitting chip 400 from the CPU 701 to transmit it to the light emission control unit 705.

Figure 7:
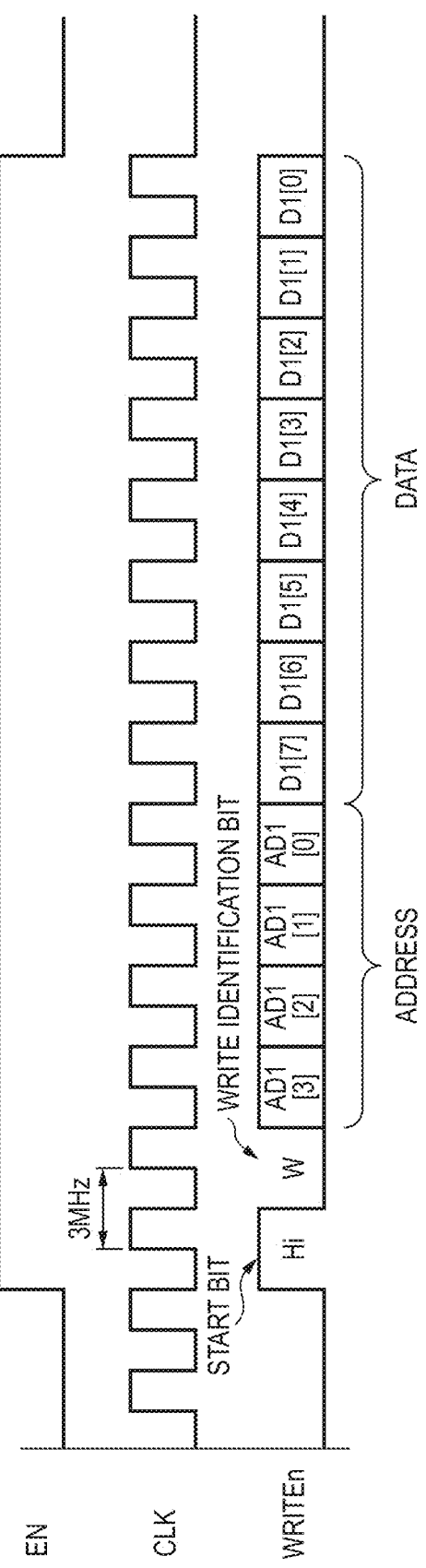
FIG. 7 is a signal chart related to access to a register of the light-emitting chip according to an embodiment of the subject disclosure.

FIG. 7 shows transition of the signal level on each signal line when writing control data to the register of the light-emitting chip 400. An enable signal, which is at high level during communication, indicating that communication is in progress, is output to the signal line EN. The light emission control unit 705 transmits a start bit to the signal line WRITEn synchronously with the rise of the enable signal. Next, the light emission control unit 705 transmits a write identification bit indicating a write operation, and thereafter transmits an address (four bits in this example) of the register to which control data is to be written, and the control data (eight bits in this example). The light emission control unit 705 sets the frequency of the clock signal transmitted to the signal line CLK to, for example, 3 MHz when writing to the register.

Figure 8:
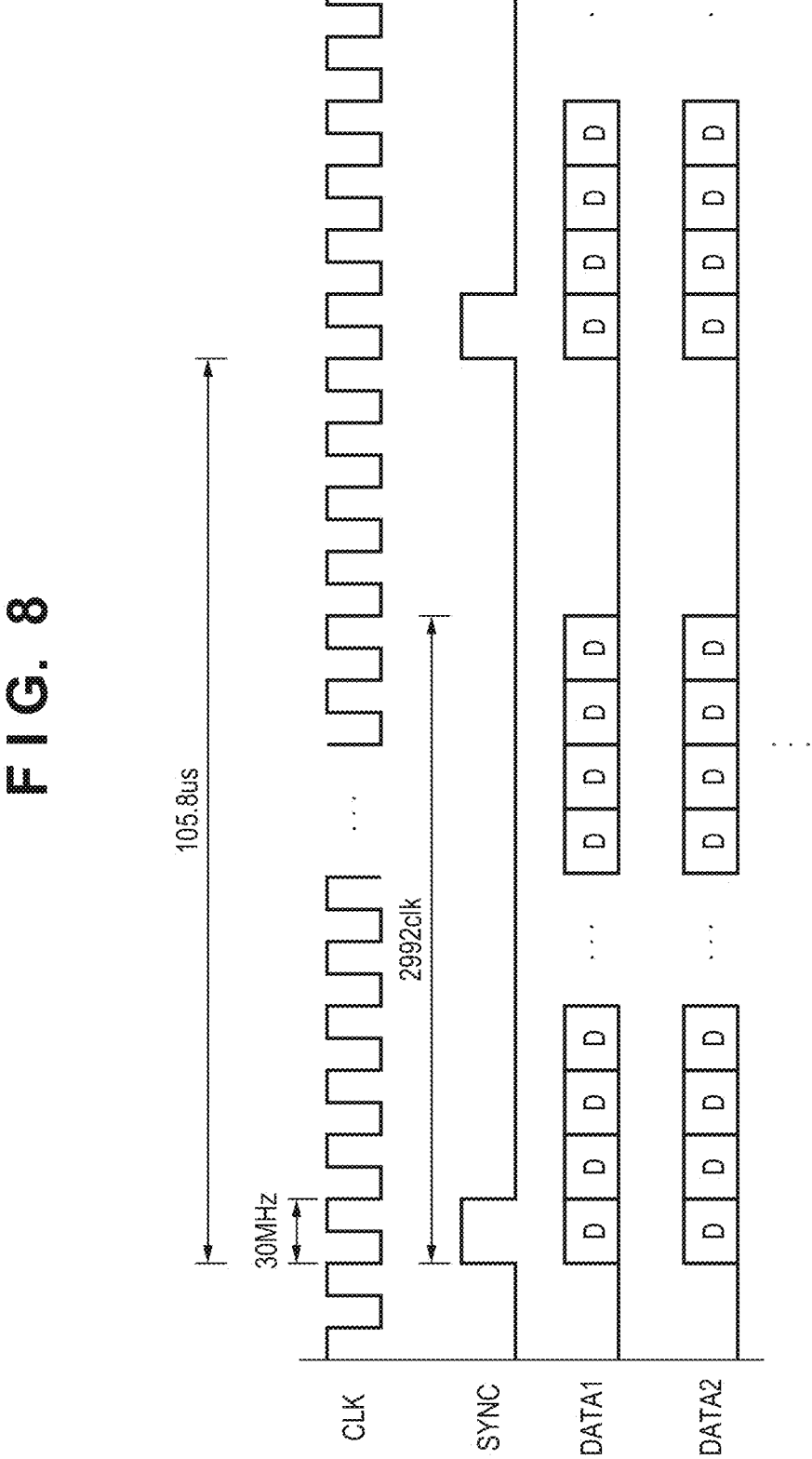
FIG. 8 is a signal chart related to transmission of image data to the light-emitting chip according to an embodiment of the subject disclosure.

FIG. 8 shows transition of the signal level on each signal line when image data is transmitted to each light-emitting chip 400. A periodic line synchronization signal, which indicates an exposure timing for each line in the photosensitive member 102, is output to the signal line SYNC. When the circumferential velocity of the photosensitive member 102 is 200 mm/s and the resolution in the circumferential direction is 1200 dpi (about 21.16 μm), the line synchronization signal is output at intervals of about 105.8 μs. The light emission control unit 705 transmits image data to the signal lines DATA1 to DATA20 synchronously with the rise of the line synchronization signal. Since each light-emitting chip 400 in the present embodiment has 2992 light-emitting elements 602, image data indicating whether or not to cause each of the 2992 light-emitting elements 602 to emit light needs to be transmitted to each light-emitting chip 400 within a period of about 105.8 μs. Therefore, in this example, the light emission control unit 705 sets the frequency of the clock signal transmitted to the signal line CLK to 30 MHz when transmitting the image data, as shown in FIG. 8.

FIG. 9 is a functional block diagram showing a detailed circuit configuration of one light-emitting chip 400 (n-th light-emitting chip 400-*n*). The light-emitting chip 400 has nine pads 408-1 to 408-9, a circuit portion 406, and a light-emitting element array 410. The pads 408-1 and 408-2 are connected to a power supply voltage VCC through a power line. Power from this power supply voltage VCC is supplied to each circuit of the circuit portion 406 of the light-emitting chip 400. The pads 408-3 and 408-4 are connected to a ground through a ground line. Each circuit of the circuit portion 406 and the upper electrode 508 are connected to a ground via the pads 408-3 and 408-4. The signal line CLK is connected to a forwarding unit 1003, a register 1102, and latch units 1004-001 to 1004-748 via the pad 408-5. The signal lines SYNC and DATAn are connected to the forwarding unit 1003 via the pads 408-6 and 408-7. The signal lines EN and WRITEn are connected to the register 1102 via the pads 408-8 and 408-9. The register 1102 stores control data indicating a magnitude of driving current to be supplied to each light-emitting element 602, for example Starting from the line synchronization signal from the signal line SYNC, the forwarding unit 1003 receives, from the signal line DATAn, input image data that includes a series of pixel values indicating whether or not to cause each one of the light-emitting elements 602 to emit light, synchronously with the clock signal from the signal line CLK. The forwarding unit 1003 performs serial-to-parallel conversion in units of M (e.g., M=4) pixel values for the series of pixel values received serially from the signal line DATAn. For example, the forwarding unit 1003 has four cascaded D flip-flops, and outputs the pixel values DATA-1, DATA-2, DATA-3, and DATA-4 that are input over four clocks to the latch units 1004-0001 to 1004-748 in parallel. The forwarding unit 1003 also has another four D flip-flops for delaying the line synchronization signal, and outputs a first latch signal to the latch unit 1004-001 via a signal line LAT1 at a timing delayed for four clocks after the line synchronization signal is input.

A k-th latch unit 1004-*k* (k is an integer from 1 to 748) holds, using a latch circuit, the four pixel values DATA-1, DATA-2, DATA-3, and DATA-4 that are input from the forwarding unit 1003 simultaneously with the input of a k-th latch signal. The k-th latch unit 1004-*k*, except for the last latch unit 1004-748, delays the k-th latch signal for four clocks and outputs a (k+1)-th latch signal to a latch unit 1004-(*k*+1) via a signal line LAT (*k*+1). The k-th latch unit 1004-*k* continues to output drive signals based on the four pixel values held by the latch circuit to a current drive unit 1104 during the signal period of the k-th latch signal. For example, there is a delay of four clocks between the timing when the first latch signal is input to the latch unit 1004-1 and the timing when the second latch signal is input to the latch unit 1004-2. Therefore, the latch unit 1004-1 outputs drive signals based on the first, second, third, and fourth pixel values to the current drive unit 1104, while the latch unit 1004-2 outputs drive signals based on the fifth, sixth, seventh, and eighth pixel values to the current drive unit 1104. In general, the latch unit 1004-*k* outputs drive signals based on (4k−3)-th, (4k−2)-th, (4k−1)-th, and (4k)-th pixel values to the current drive unit 1104. Therefore, in the embodiment shown in FIG. 9, the 748 latch units 1004-001 to 1004-748 transmit, substantially in parallel, 2992 drive signals for controlling driving of 2992 (=748×4) light-emitting elements 602 to the current drive unit 1104. Each drive signal is a binary signal that indicates high level or low level.

The current drive unit 1104 has 2992 light emission drive circuits respectively corresponding to 2992 light-emitting elements 602 of the light-emitting element array 410. Each light emission drive circuit causes a driving current having a magnitude indicated by control data in the register 1102 to flow to the light-emitting layer 506 of the corresponding light-emitting element 602 while the corresponding drive signal indicates high level meaning that light emission should be ON. As a result, the light-emitting elements 602 emit light at the target amount of light. Note that the control data may indicate one individual current value for each light-emitting element 602, indicate one current value for each group of light-emitting elements 602, or indicate one current value in common to all light-emitting elements 602.

3. Multiple Exposure Control

Figure 10:
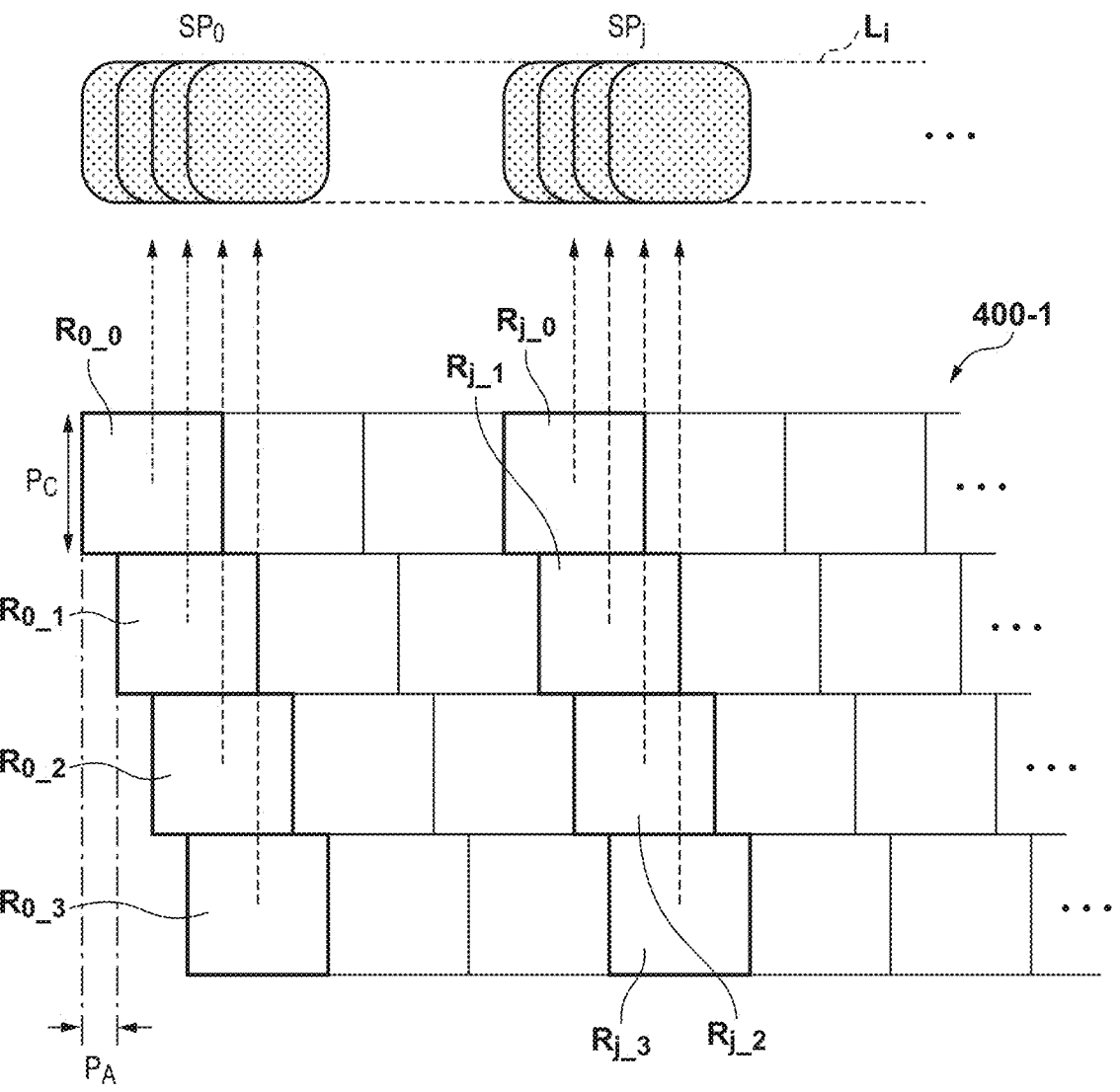
FIG. 10 is an illustrative diagram regarding multiple exposure with light-emitting elements arranged in a staircase pattern of the subject disclosure.

Although FIG. 4 shows an example where the light-emitting elements 602 are arranged completely in a grid-like pattern in each light-emitting chip 400, the M light-emitting elements 602 of each column may be arranged in a staircase pattern with a constant pitch. FIG. 10 is an illustrative diagram regarding multiple exposure performed with light-emitting elements arranged in a staircase pattern. Here, an example of an arrangement of light-emitting elements in the light-emitting chip 400-1 is partially illustrated where M=4. $R_{j\_m}$ (j={0, 1, . . . , J–1}, m={0, 1, 2, 3}) in the figure represents a light-emitting element 602 in a j-th column from the left in the axial direction and an m-th row from the top in the circumferential direction. The pitch Pc of the light-emitting elements in the circumferential direction may be about 21.16 μm, as mentioned above. The interval in the axial direction between two adjoining light-emitting elements of the M light-emitting elements in each column, that is, the pitch PA of the light-emitting elements in the axial direction may be about 5 μm corresponding to the resolution of 4800 dpi.

As the four light-emitting elements in each column are arranged in the staircase pattern in this manner, any two adjoining light-emitting elements among those four light-emitting elements occupy partially overlapping ranges in the axial direction. The four light-emitting elements in a column corresponding to each pixel position on input image data successively emit light while the photosensitive member 102 rotates, thereby forming a spot corresponding to the pixel position on the surface of the photosensitive member 102. In the example in FIG. 10, when the pixel value at the left end of an i-th line of input image data indicates that light emission should be ON, light-emitting elements $R_{0\_0}$, $R_{0\_1}$, $R_{0\_2}$, and $R_{0\_3}$ successively emit light at timings at which the respective light-emitting elements face a line Li on the surface of the photosensitive member 102. As a result, the spot region at the left end of the line Li is subjected to multiple exposure, and a corresponding spot $SP_0$ is formed. Similarly, when a j-th pixel value from the left end of the i-th line of the input image data indicates that light emission should be ON, light-emitting elements $R_{j\_0}$, $R_{j\_1}$, $R_{j\_2}$, and $R_{j\_3}$ successively emit light at timings at which the respective light-emitting elements face the line Li on the surface of the photosensitive member 102. As a result, a j-th spot region from the left end of the line Li is subjected to multiple exposure, and a corresponding spot $SP_j$ is formed.

In FIG. 10, the light-emitting elements in adjoining two columns occupy partially overlapping ranges and, likewise, the light-emitting elements in two columns located at a boundary of adjoining two light-emitting chips 400 also occupy partially overlapping ranges in the axial direction. That is, within the adjoining two light-emitting chips 400, the light-emitting elements of the right-end column of the left light-emitting chip 400 and the light-emitting elements of the left-end column of the right light-emitting chip 400 also occupy partially overlapping ranges in the axial direction. The pitch PA of the light-emitting elements in the axial direction is constant at about 5 μm throughout the entire twenty light-emitting chips 400. As a result of four light-emitting elements in each column of these light-emitting chips 400 successively emitting light at appropriate timings, a smooth line of an electrostatic latent image that is constituted by a series of spots with a constant spot interval that partially overlap with each other may be formed on the surface of photosensitive member 102. Then, a two-dimensional electrostatic latent image is produced as a result of such lines being continuously formed in the circumferential direction.

4. Improvement of Resistance Against Outside Air Intrusion

In a case where the light-emitting chips 400-1 to 400-20 are arranged in a staggered manner along the reference line 310 as described with reference to FIGS. 3B and 4, there exists a gap G, in a direction perpendicular to the reference line 310, between a light-emitting element array on one side of the reference line 310 and a light-emitting element array on the other side. The smaller this gap G is, the more efficiently light from the light-emitting element arrays is introduced into the rod lens array 203. However, if the gap G is too small, it would be difficult to ensure a sufficient interval between a side (first side) that is parallel to the reference line 310 and closer to the reference line 310 among the four sides of each light-emitting chip 400 and the light-emitting element array. This interval is indicated by reference sign L in FIG. 4. The inventors have found an issue that, when the interval L is not large enough, moisture and oxygen included in outside air intruding into the chip through the first side easily reach the light-emitting element array and increase the likelihood of deterioration of the light-emitting elements 602. Especially, in a case where a light-emitting chip is manufactured by forming an array of organic EL elements on a silicon substrate, after manufacturing the light-emitting chip, the interval L less than 20 μm sometimes caused light-emitting elements to fall in non-illuminated state even if the light-emitting element array is covered by a sealing film.

In the present embodiment, each light-emitting chip 400 is manufactured to have the interval L that is equal to or larger than 20 μm between the first side of the light-emitting chip 400 and the light-emitting element array 410 of the light-emitting chip 400. Typically, the light-emitting element array 410 of each light-emitting chip 400 is formed on a first surface of a silicon substrate 402 and is covered by a sealing film made of an insulating inorganic material. Thus, the light-emitting layer 506 that is an organic EL film is protected from deterioration-causing substances. The sealing film may be a thin film of silicon oxide, silicon nitride, or aluminum oxide, for example, or a stack of two or more of them.

In addition, each light-emitting chip 400 may further include a metal film formed between the silicon substrate 402 and the sealing film such that it at least partially surrounds the light-emitting element array 410 on the first surface of the silicon substrate 402. The metal film may be made of, for example, aluminum, copper, titanium, chromium, or any combination thereof so that high adhesion to the sealing film will prevent intrusion of deterioration-causing substances to a maximum extent. The existence of the metal film around the light-emitting element array 410 prevents most of the moisture and oxygen that have reached a boundary surface between the silicon substrate 402 and the sealing film from further intruding into the chip.

Figure 11:
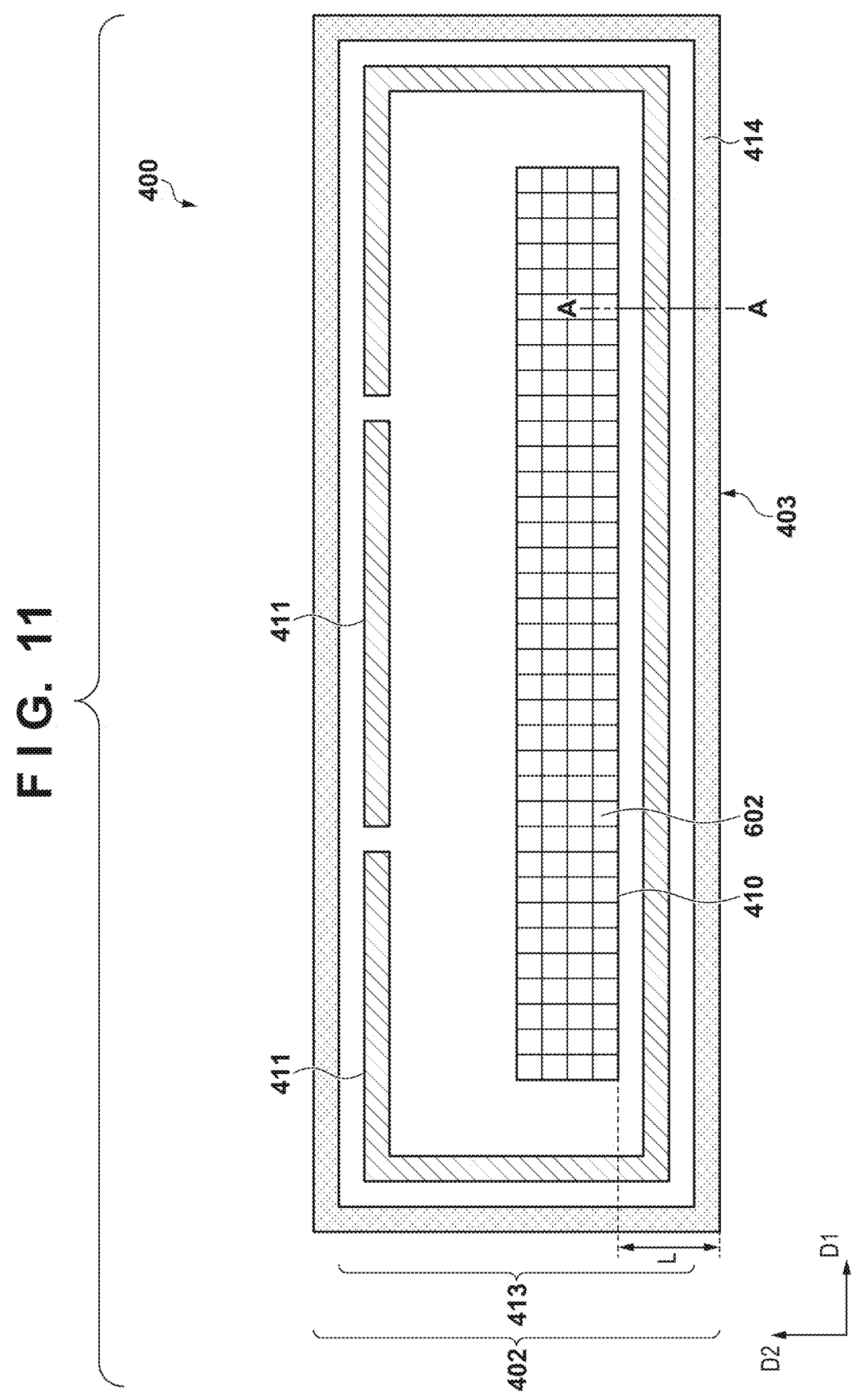
FIG. 11 is a plan view of a configuration of the light-emitting chip according to an embodiment of the subject disclosure.
Figure 12:
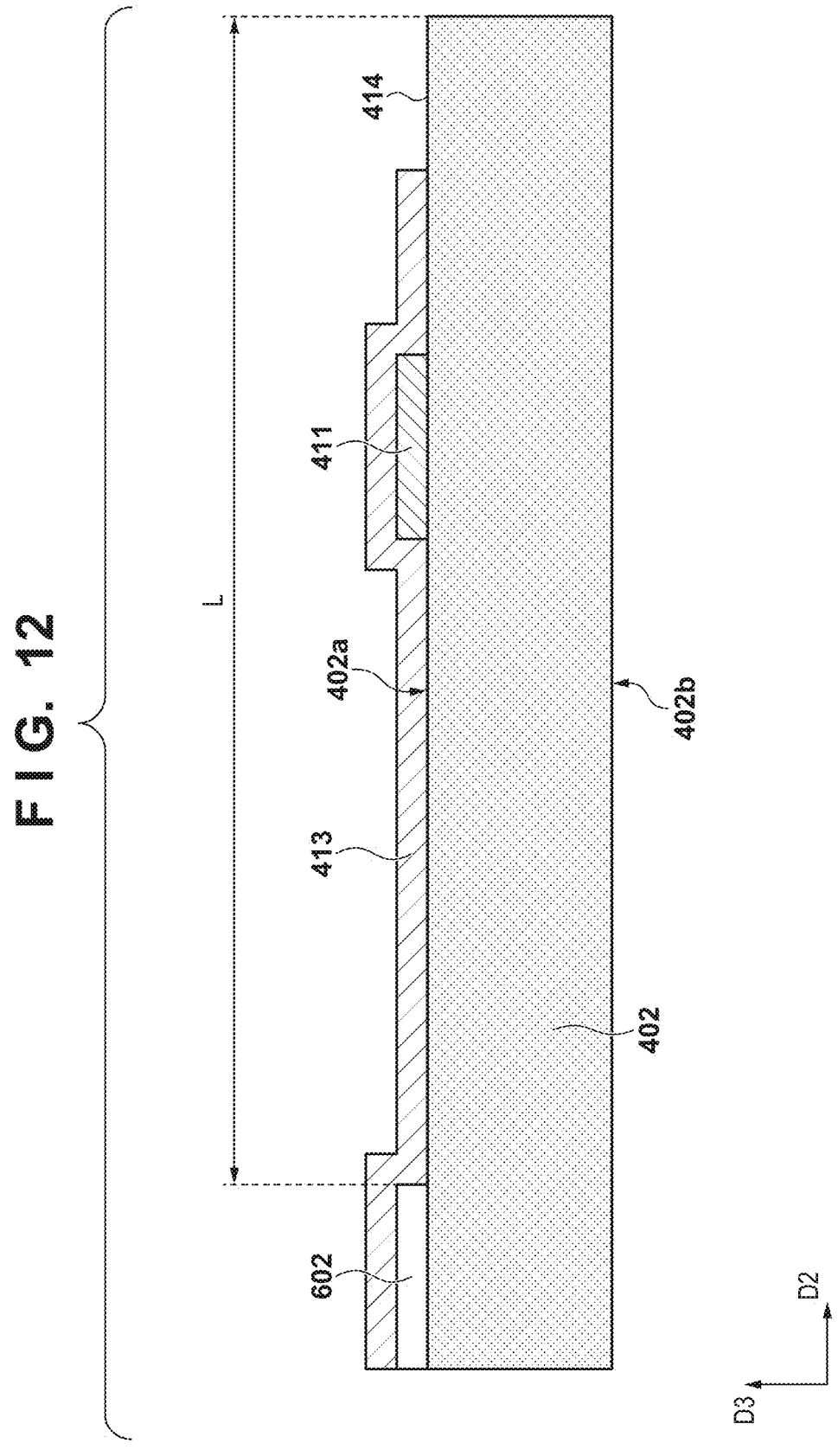
FIG. 12 is a partial cross-sectional view showing an example of a configuration of the light-emitting chip according to an embodiment of the subject disclosure.

FIG. 11 is a plan view showing an example of a configuration of the light-emitting chip 400 according to an embodiment. FIG. 12 is a partial cross-sectional view taken along the line A-A of FIG. 11 as viewed from the axial direction D1. A direction D3 is a direction perpendicular to the axial direction D1 and the circumferential direction D2.

In the illustrated embodiment, the silicon substrate 402 of the light-emitting chip 400 includes a first surface 402a and a second surface 402b, and the light-emitting element array 410, which is a two-dimensional array of the light-emitting elements (organic EL elements) 602, is formed on the first surface 402a. A region (light-emitting element region) where the light-emitting element array 410 is formed on the first surface 402a is not in the center but nearer a first side 403 of the light-emitting chip 400 in the circumferential direction D2. The first side 403 is a side that is set parallel to the reference line 310 when the light-emitting chip 400 is arranged on the printed circuit board 202 and is located in the vicinity of the reference line 310.

Further, a metal film 411 is formed such that it at least partially surrounds the light-emitting element array 410 on the first surface 402a. FIG. 11 shows an example where some parts of the metal film 411 in a strip shape surrounding the light-emitting element array 410 are missing at the opposite side to the first side 403. However, the metal film 411 may fully surround the light-emitting element array 410. The missing parts of the metal film 411 may be utilized for wiring of the pads 408-1 to 408-9, for example. Further, FIG. 12 shows an example where the metal film 411 is fully covered by the sealing film 413. However, a part of the metal film 411 may be exposed to the outside without being covered by the sealing film 413. Although not illustrated in FIGS. 11 and 12, further components constituting the circuit portion 406 of the light-emitting chip 400 are arranged inside the inner perimeter of the metal film 411.

The light-emitting element array 410 and the metal film 411 are covered by the sealing film 413. However, the silicon substrate 402 of the light-emitting chip 400 includes a non-sealed region 414 that is not covered by the sealing film 413 at least between the metal film 411 and the first side 403. In the example of FIG. 11, the non-sealed region 414 extends along the all four sides of the silicon substrate 402. The existence of the non-sealed region 414 prevents cracking or peeling from occurring in the sealing film 413 when the light-emitting chip 400 is cut out from a silicon wafer by a dicing process.

FIGS. 11 and 12 also show the interval L between the light-emitting element array 410 and the first side 403 of the light-emitting chip 400. As described above, with the interval L that is equal to or larger than 20 μm, the light-emitting elements 602 of the light-emitting element array 410 can be completely protected from outside air that reaches a boundary surface between the silicon substrate 402 and the sealing film 413. Respective intervals between the light-emitting element array 410 and the other three sides of the light-emitting chip 400 may be equal to or larger than 20 μm. In addition, with the interval L that is equal to or less than 200 μm, it is possible to ensure sufficient efficiency with which light is introduced into the rod lens array 203. Note that, as a technique for reducing chipping in the dicing process, stealth dicing using a laser is known. In a case where the light-emitting chip 400 is cut out from a silicon wafer by stealth dicing, the interval L may be equal to or larger than 30 μm so that, even in the event of vapor deposition blur in the organic EL elements or chipping, a sufficient interval from an edge to the light-emitting element array can be ensured.

FIG. 13 is a flowchart illustrating an example of a flow of a manufacturing method for manufacturing the light-emitting chips 400 used in the above-described exposure head 106. The manufacturing method illustrated in FIG. 13 can be realized by a processor of some sort of semiconductor manufacturing apparatus executing a computer program. Note that reference sign 'S' in the figure represents a processing step.

First, in S101, cutting lines for dicing are defined in a grid on a first surface of a silicon wafer. Sections surrounded by the cutting lines defined here will respectively become substrates each constituting a light-emitting chip 400. Next, in S102, a light-emitting element region is defined within each section with a spacing of at least 20 μm from the cutting line. As a result, a plurality of light-emitting element regions are arranged on the first surface at an interval from each other. In an example, the interval between the cutting line and the light-emitting element region may be equal to or larger than 30 μm.

Then, in S103, a metal film 411 at least partially surrounding the light-emitting element region is formed in each section on the first surface of the silicon wafer. Next, in S104, an array (light-emitting element array 410) of organic EL elements 602 each including a lower electrode 504, a light-emitting layer 506, and an upper electrode 508 is formed in each light-emitting element region. Next, in S105, the rest of the components constituting the circuit portions 406 of the light-emitting chips 400 are formed.

Then, in S106, a plurality of sealing films 413 that respectively cover a plurality of light-emitting element arrays 410 are formed on the first surface. Each sealing film 413 formed here also covers the metal film 411 surrounding the corresponding light-emitting element array 410 together with the light-emitting element array 410. For example, the sealing film 413 can be formed by an atomic layer deposition (ALD) method that has superior performance in covering an uneven structure. It should be noted that there remains a non-sealed region 414 around the sealing film 413 in each section. For example, the sealing films 413 may be formed while the non-sealed region 414 is masked. Alternatively, some parts of a sealing film 413 that has been formed on the entire surface may be removed by dry etching or wet etching (while the other regions are masked) to form non-sealed regions 414. Typically, each sealing film 413 is formed in such a manner that it does not overlap the cutting lines defined in a grid in S101.

Then, in S107, a plurality of light-emitting chips 400 are cut out by cutting the silicon wafer (for example, stealth dicing) along the cutting lines located in the non-sealed regions 414. Next, in S108, the plurality of cut out light-emitting chips 400 are each packaged. Although not illustrated in FIG. 13, an exposure head 106 can be manufactured through further arranging the light-emitting chips 400 on a printed circuit board 202, connecting the light-emitting chips to an image controller 700, and mounting the printed circuit board 202 and a rod lens array 203 on a housing 204.

Note that the processing steps illustrated in FIG. 13 are not necessarily executed in the illustrated order. For example, the formation of the light-emitting element array within each section may be performed before the formation of the metal film. Further, some of the illustrated processing steps may be omitted or another processing step may be added.

5. Summary

Thus far, various embodiments of the technology according to the present disclosure have been described in detail using FIGS. 1 to 13. According to the embodiment described above, an exposure apparatus includes a plurality of light-emitting chips arranged in a staggered manner along a reference line that is parallel to an axial direction of a photosensitive member, and a rod lens array that images light from light-emitting element arrays of the plurality of light-emitting chips onto a surface of the photosensitive member. The light-emitting element array of each light-emitting chip is an array of organic EL elements formed on a first surface of a silicon substrate. An interval between a first side of the silicon substrate of each light-emitting chip and the light-emitting element array of the light-emitting chip is equal to or larger than 20 micrometers, and the first side is parallel to the reference line and closer to the reference line among sides of the silicon substrate. By thus ensuring a sufficient interval between an edge of the light-emitting chip and the light-emitting element array, it is possible to provide an exposure apparatus that is highly reliable with improved resistance against outside air intrusion through the edge into the chip.

Although some specific numerical values have been used for explanations in this specification, these specific numerical values are mere examples, and the present disclosure is not limited to these specific numerical values used in the embodiments. Specifically, the number of light-emitting chips provided on one printed circuit board is not limited to twenty, and may be any number that is one or more. The size of the light-emitting element array in each light-emitting chip 400 is not limited to four rows×748 columns, and may be any other size. The pitch in the circumferential direction and the pitch in the axial direction of the light-emitting elements are not limited to about 21.16 μm and about 5 μm, and may take any other values.

6. Other Embodiments

Embodiment(s) of the present disclosure can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of priority from Japanese Patent Application No. 2023-123761, filed on Jul. 28, 2023 which is hereby incorporated by reference herein in its entirety.

What is claimed is:

1. An exposure apparatus comprising:
a plurality of light-emitting chips arranged in a staggered manner along a reference line that is parallel to an axial direction of a photosensitive member, each of the plurality of light-emitting chips having a silicon substrate and a light-emitting element array that is an array of organic electro luminescence (EL) elements formed on a first surface of the silicon substrate; and
a rod lens array that images light from the light-emitting element arrays of the plurality of light-emitting chips onto a surface of the photosensitive member,
wherein an interval between a first side of the silicon substrate of each light-emitting chip and the light-emitting element array of the light-emitting chip is equal to or larger than 20 micrometers, the first side being parallel to the reference line and closer to the reference line among sides of the silicon substrate.

2. The exposure apparatus according to claim 1, wherein each of the plurality of light-emitting chips further includes
a sealing film that covers the light-emitting element array of the light-emitting chip and is made of an insulating inorganic material.

3. The exposure apparatus according to claim 2, wherein each of the plurality of light-emitting chips further includes
a metal film formed between the silicon substrate and the sealing film such that the metal film at least partially surrounds the light-emitting element array on the first surface of the silicon substrate.

4. The exposure apparatus according to claim 3, wherein the silicon substrate of each of the plurality of light-emitting chips includes a non-sealed region that is not covered by the sealing film between the metal film and the first side.

5. The exposure apparatus according to claim 1, wherein the interval between the first side and the light-emitting element array of each of the plurality of light-emitting chips is equal to or larger than 30 micrometers.

6. An image-forming apparatus comprising:
an exposure apparatus, and
a photosensitive member,
wherein the exposure apparatus includes:
a plurality of light-emitting chips arranged in a staggered manner along a reference line that is parallel to an axial direction of the photosensitive member, each of the plurality of light-emitting chips having a silicon substrate and a light-emitting element array that is an array of organic electro luminescence (EL) elements formed on a first surface of the silicon substrate; and
a rod lens array that images light from the light-emitting element arrays of the plurality of light-emitting chips onto a surface of the photosensitive member,
wherein an interval between a first side of the silicon substrate of each light-emitting chip and the light-emitting element array of the light-emitting chip is equal to or larger than 20 micrometers, the first side being parallel to the reference line and closer to the reference line among sides of the silicon substrate.

7. A manufacturing method for manufacturing a light-emitting chip for use in an exposure apparatus configured to expose a photosensitive member with light from a plurality of light-emitting chips, comprising:

forming, on a first surface of a silicon substrate, a plurality of light-emitting element arrays spaced apart from each other, each of the plurality of light-emitting element arrays being an array of organic electro luminescence (EL) elements;

forming, on the first surface of the silicon substrate, a plurality of sealing films to cover the plurality of light-emitting element arrays, respectively, the sealing films being made of an insulating inorganic material; and cutting the silicon substrate along a cutting line located in a non-sealed region that is not covered by the plurality of sealing films.

8. The manufacturing method according to claim 7, further comprising:

forming a plurality of metal films to at least partially surround respective ones of the plurality of light-emitting element arrays on the first surface before forming the plurality of sealing films on the first surface of the silicon substrate, wherein each of the plurality of sealing films covers a corresponding light-emitting element array and a metal film.

9. The manufacturing method according to claim 7, wherein an interval between the cutting line and a light-emitting element array within a section defined by the cutting line on the first surface of the silicon substrate is equal to or larger than 20 micrometers.

10. The manufacturing method according to claim 9, wherein the interval between the cutting line and the light-emitting element array within a section defined by the cutting line on the first surface of the silicon substrate is equal to or larger than 30 micrometers.

* * * * *